(12) United States Patent
Yang et al.

(10) Patent No.: US 9,824,917 B2
(45) Date of Patent: *Nov. 21, 2017

(54) METHOD AND APPARATUS FOR SINGLE CHAMBER TREATMENT

(71) Applicant: International Business Machines Corporation, Armonk, NY (US)

(72) Inventors: Chih-chao Yang, Glenmont, NY (US); Daniel Charles Edelstein, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/496,172

(22) Filed: Apr. 25, 2017

(65) Prior Publication Data

US 2017/0301584 A1    Oct. 19, 2017

Related U.S. Application Data

(63) Continuation of application No. 15/352,917, filed on Nov. 16, 2016, now Pat. No. 9,702,042, and a (Continued)

(51) Int. Cl.
*H01L 21/768* (2006.01)
*H01L 21/321* (2006.01)
*H01L 23/522* (2006.01)
*H01L 23/528* (2006.01)
*H01L 23/532* (2006.01)

(52) U.S. Cl.
CPC .... *H01L 21/76834* (2013.01); *H01L 21/3212* (2013.01); *H01L 21/7684* (2013.01); *H01L 21/76802* (2013.01); *H01L 21/76826* (2013.01); *H01L 21/76831* (2013.01); *H01L 21/76843* (2013.01); *H01L 21/76861* (2013.01); *H01L 21/76877* (2013.01); *H01L 23/528* (2013.01); *H01L 23/5226* (2013.01); *H01L 23/53238* (2013.01)

(58) Field of Classification Search
CPC ........... H01L 21/76834; H01L 21/3212; H01L 21/76802; H01L 21/76826; H01L 21/76831; H01L 21/7684; H01L 23/5226; H01L 23/528; H01L 23/53238
See application file for complete search history.

(56) References Cited

U.S. PATENT DOCUMENTS 6,417,098 B1 * 7/2002 Wong ................ H01L 21/02063
                                                    257/E21.251
8,169,077 B2    5/2012 Yang et al.
(Continued)

*Primary Examiner* — Nathan W Ha

(57) ABSTRACT

The disclosure relates to using a single chamber for multiple treatments resulting in a semiconductor chip having an interconnect. An exemplary process many include forming a via to expose several layers of a microchip. The layers may include, pattered dielectric layer, a capping layer, a first metal layer and an insulator. A surface modification step is then implemented to modify and/or densify the treated surfaces of the dielectric surface. A metal compound removal step is then implemented to remove metal compounds from the bottom of the via. Finally, the via is filled with a conductive material. The surface modification and the metal compound removal steps are implemented in one chamber.

1 Claim, 4 Drawing Sheets

Related U.S. Application Data continuation of application No. 15/130,814, filed on Apr. 15, 2016, now Pat. No. 9,536,780.

(56) References Cited

U.S. PATENT DOCUMENTS

| | | | |
|---|---|---|---|
| 8,242,019 B2 | 8/2012 | Ishizaka et al. | |
| 2008/0054467 A1* | 3/2008 | Ohba | H01L 21/76826 257/751 |
| 2009/0278228 A1* | 11/2009 | Hsu | H01L 23/5256 257/529 |
| 2012/0168949 A1* | 7/2012 | Maekawa | H01L 21/76805 257/751 |
| 2013/0093089 A1* | 4/2013 | Yang | H01L 21/76846 257/751 |
| 2013/0105996 A1* | 5/2013 | Brink | H01L 21/76802 257/786 |
| 2014/0099789 A1 | 4/2014 | Kolics | |
| 2015/0235962 A1* | 8/2015 | Noguchi | H01L 23/53295 257/760 |
| 2015/0287675 A1* | 10/2015 | Shaviv | H01L 23/5226 257/774 |

* cited by examiner

METHOD AND APPARATUS FOR SINGLE CHAMBER TREATMENT

This application is a continuation of application Ser. No. 15/130,814, filed Apr. 15, 2016 and application Ser. No. 15/352,917 filed Nov. 16, 2016. Priority is claimed to both applications and the disclosure of each application is incorporated herein in its entirety.

BACKGROUND

Field

The disclosure relates to a method, apparatus and system to provide single chamber treatment for dielectric surface modification and selective metal compound removal Description of Related Art Conventional semiconductor devices include a plurality of circuits which form an integrated circuit fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. Within a typical interconnect structure, metal vias run perpendicular to the semiconductor substrate and metal lines run parallel to the semiconductor substrate.

As millions of devices and circuits are squeezed on a semiconductor substrate (or a chip), the wiring density and the number of metal levels are both increased generation after generation. In order to provide low RC for high signal speed, low k dielectric materials having a dielectric constant of less than silicon dioxide as well as copper-containing lines are becoming a necessity. The quality of thin metal wirings and studs formed by a conventional damascene process is extremely important to ensure yield and reliability. The major problem encountered in this area today is poor mechanical integrity of deep submicron metal studs embedded in low k dielectric materials, which can cause unsatisfied thermal cycling and stress migration resistance in interconnect structures. This problem becomes increasingly severe when either new metallization approaches or porous low k dielectric materials are used.

SUMMARY OF THE INVENTION

In one embodiment, the disclosure relates to a method, system and apparatus for single chamber treatment of a semiconductor device. In one embodiment, the single chamber may be used for dielectric surface modification and selective compound removal. An exemplary dielectric surface modification may modify one or more surface properties of the semiconductor device being constructed. For example, the surface properties may be modified from hydrophobic to hydrophilic, densify the dielectric layer and/or increase copper (Cu) diffusion barrier properties. The modified dielectric surface enables advanced thin film depositions (i.e., enhanced nucleation of ALD/CVD deposition as well as enhanced interfacial adhesion.

BRIEF DESCRIPTION OF THE DRAWINGS

These and other embodiments of the disclosure will be discussed with reference to the following exemplary and non-limiting illustrations, in which like elements are numbered similarly, and where.

DETAILED DESCRIPTION

In on embodiment, the disclosure relates to microchip processing that in a single chamber and at a single processing unit. The processing may include modifying the dielectric surface condition and selective removal of metal compounds from the microchip surface. Conventional methods implemented these steps in two different chambers which is time consuming, error prone and expensive. In one embodiment, the dielectric surface modification can result in changing the microchip surface from a hydrophobic to hydrophilic surface. The surface density may also be increased in this process. The surface compound may include Silicon (Si), Nitrogen ($N_2$), Ammonia ($NH_3$), Phosphorous (P), Boron (B), Oxygen ($O_2$) or other chemicals. Two process conditions may be included: thermal and direct plasma.

Figure 1:
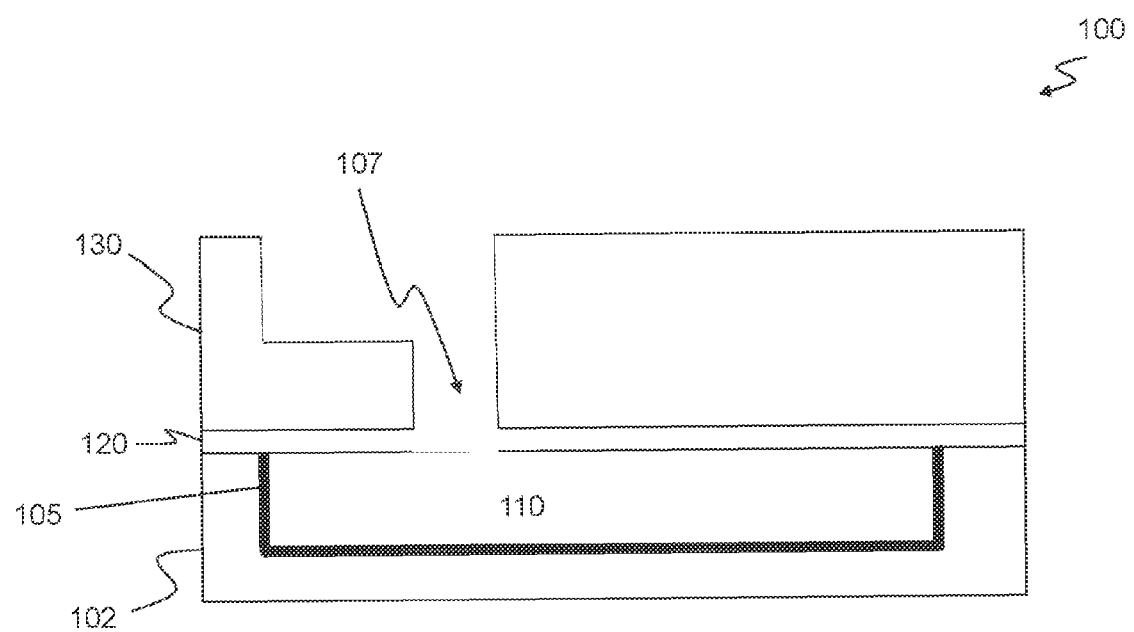
FIG. 1 schematically shows post dielectric patterning of a microchip according to one embodiment of the disclosure.

FIG. 1 schematically shows post dielectric patterning of a microchip according to one embodiment of the disclosure. Microchip 100 of FIG. 1 includes insulator layer 102, conductor layer 110, capping layer (interchangeably, diffusion insulator) 120 and patterned dielectric layer 130. Layer 130 may comprise a low-k dielectric layer. Layer 120 may define a dielectric capping layer to prevent copper (Cu) 110 diffusion into the dielectric layer 130. Conductor layer 110 may comprise Cu.

In one embodiment, the conductor material may be Cu. Cavity 107 was formed in layer 130 through conventional patterning process including both lithography and reactive ion etch. Cavity 107 is formed to provide space for another metal layer as shown below in order to provide an interconnect connection with the previous conductive layer 110. Cavity 107 forms a via which exposes the conductor's surface. Liner 105 is disposed over insulator layer 102 to separate insulator layer 102 from the metal (interchangeably, conductor) layer 110. The liner layer may comprise one or more metals, including, Ta, Ti, Ru, Co, W and their nitrides. The liner material may include alloys of these metals.

In one embodiment of the disclosure, the dielectric capping layer 120 may be of different material than the low-k dielectric material 130. In another embodiment, the capping material may comprise SiN or SiC.

Figure 2A:
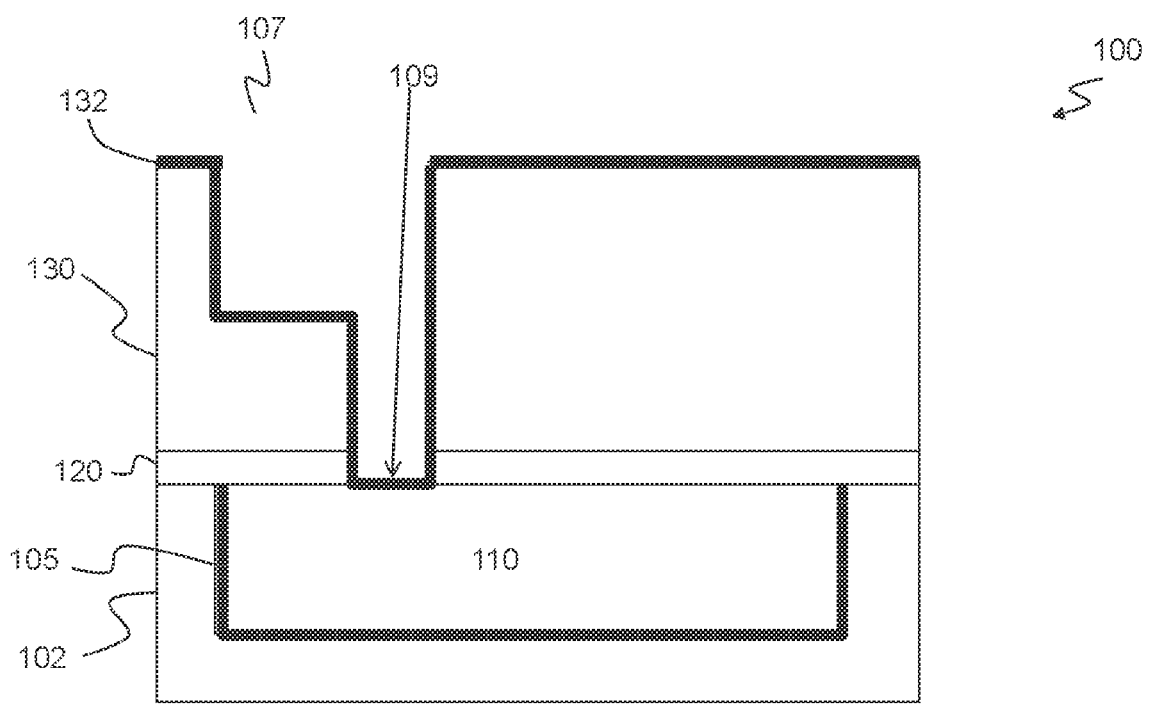
FIG. 2A illustrates the single chamber dielectric modification step according to one embodiment of the disclosure.

FIG. 2A illustrates the single chamber dielectric modification step according to one embodiment of the disclosure. Specifically, FIG. 2A shows an exemplary nitridation treatment in which layer 132 has been implemented over layer patterned dielectric layer 130. The region 132 over patterned dielectric layer represents areas having had surface modification on the dielectric layer 130.

The dielectric surface modification may be suitable to increase the surface density of the patterned dielectric layer 130. It may also modify the surface properties of the treated area, and for simplicity the modified region on the surface of layer 130 is illustrated as a separate layer 132. For example, the surface treatment may modify the dielectric layer surface of layer 130 from hydrophobic to hydrophilic. Layer 132 may comprise one or more of Si, $NH_x$, $N_x$, P, B and $O_x$, alone or contained in chemicals. The modified dielectric surface enables advanced thin film depositions (i.e., enhanced nucleation of ALD/CVD deposition) and enhanced interfacial adhesion.

In one embodiment, the surface modification layer 132 may be formed under a first condition of thermal evaporation. In another embodiment, layer 132 may be formed under a second condition of direct plasma deposition. The performing electrical bias range is between about 100~800 W. After dielectric surface modification, cavity (or via) 107 remains largely intact. Layer 132 extends through the bottom of the via, as shown schematically in region 109.

Figure 2B:
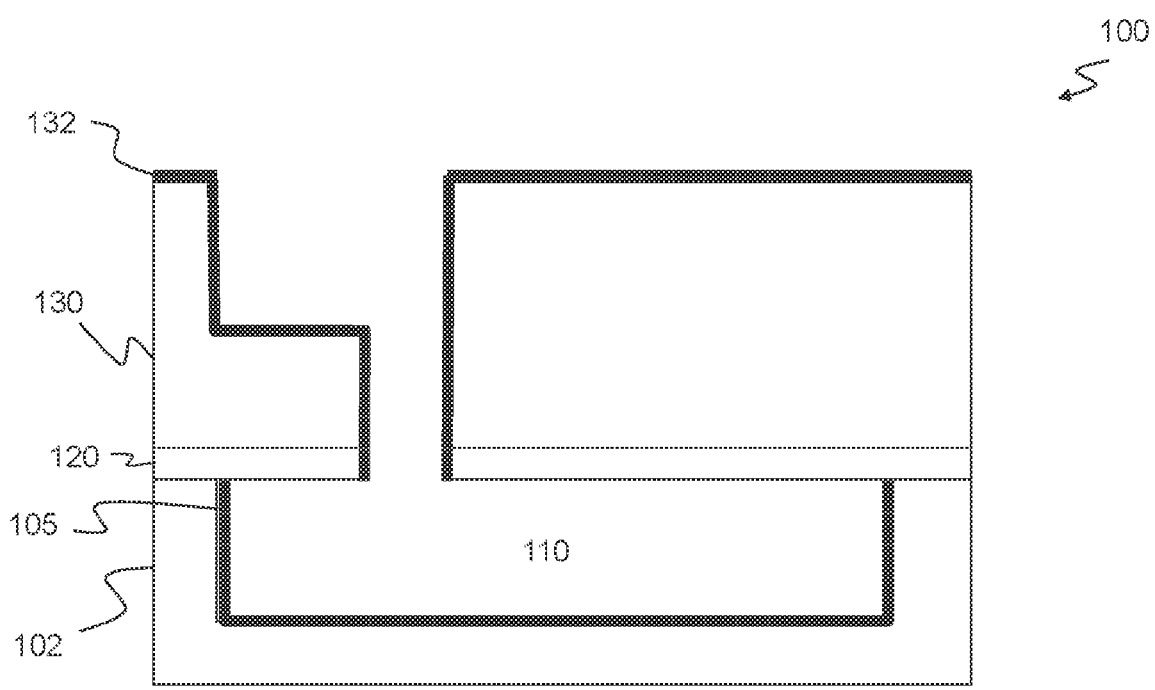
FIG. 2B illustrates the metal compound removal step in the same chamber as step 2A.

FIG. 2B illustrates the metal compound removal step for the microchip of step 2A. In one embodiment of the disclosure, steps shown in FIGS. 2A and 2B are implemented in the same chamber. In FIG. 2B, a portion of the region 109 (i.e., copper nitride, $CuN_x$) shown in FIG. 2A is removed from the bottom of cavity 107. In an exemplary embodiment, the steps of surface modification and selective metal compound removal is done at the same chamber. Here, one or more of $H_2$, He, or mixture of these material may be used for the selective removal. In one embodiment, the performing electrical bias used in the remote plasma treatment can be less than 100 W.

Figure 3:
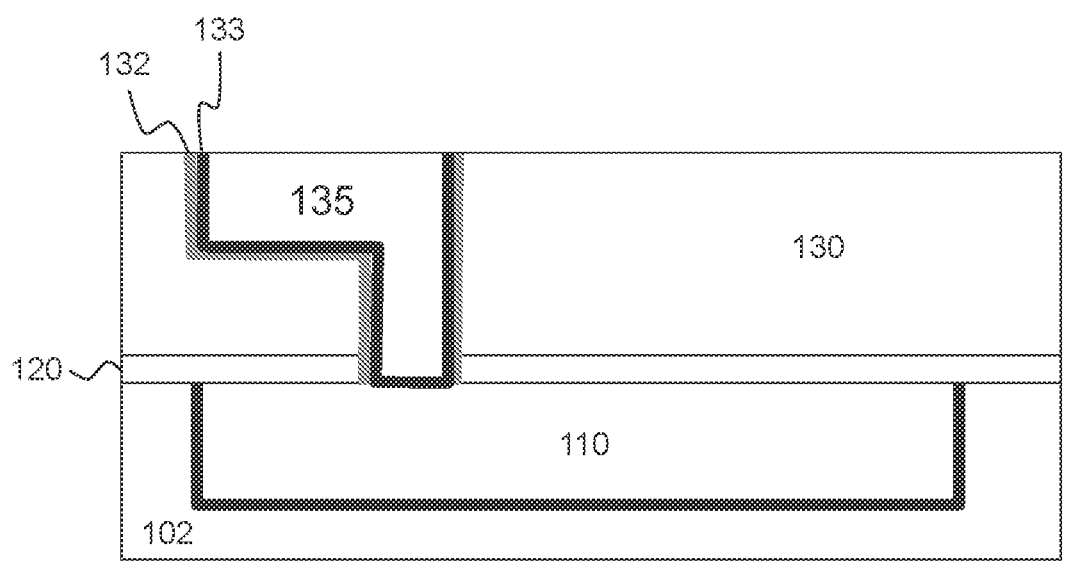
FIG. 3 illustrates the complete metallization with copper fillings and CMP.

FIG. 3 illustrates the complete metallization with Cu fill and CMP. In FIG. 3, modified dielectric surface layer 132 is shown to be adjacent to low-k dielectric layer 132. Liner material 133 is formed over the dielectric layer 132. Metal fill (e.g., Cu) is added to fill the via and form second metal layer (interconnect) 135. The second metal layer may be the same as the first metal layer (e.g., Cu). Though not shown, additional layers may be added to cover the Cu fill layer 135 and dielectric layer 130.

In one embodiment of the disclosure, the metallization is completed by filling via 135 with a conductive material (e.g., Cu) and by performing Chemical-Mechanical Polishing (CMP) after the filling operation. The CMP step removes excess Cu fill from the field area 135.

While the principles of the disclosure have been illustrated in relation to the exemplary embodiments shown herein, the principles of the disclosure are not limited thereto and include any modification, variation or permutation thereof.

What is claimed is:

1. A system for forming a microchip stack having one or more interconnects, the system comprising:
    a first chamber to receive to receive an insulator layer having a cavity therein;
    a first processor cooperative with the first chamber, the first processor configured to:
        form a first liner layer on the insulator layer to substantially cover the cavity;
        form a first metal layer over the liner layer;
        form a dielectric capping layer over the first metal layer and a portion of the insulator layer;
        form a dielectric layer over the dielectric capping layer;
        form both a line and a via through a region of the dielectric layer and extend the via to expose a portion of the dielectric capping layer and a portion of the first metal layer, the via configured to receive an interconnect layer;
        surface treat the line and the via, the surface treatment including treatment with one or more of Si, $NH_3$, $N_2$, P, B and $O_2$;
        selectively remove one or more metal compounds from a portion of the via adjacent the first metal layer to thereby expose a first area on the first metal layer, wherein one or more of $H_2$ or He is used to remove one or more metal compounds;
        deposit a second liner layer over the surface treated via and the first area; and
        fill the via with a conductive material to form the interconnect;
    wherein at least the steps of surface treating the patterned dielectric surface and removing one or more metal compounds are conducted at the first chamber and wherein the first metal layer and the conductive material comprise Cu, and
    wherein the dielectric surface densifies the treated surface and changes the treated dielectric surface from hydrophobic to hydrophilic.

* * * * *